United States Patent
Rivero et al.

(10) Patent No.: US 8,704,327 B2
(45) Date of Patent: Apr. 22, 2014

(54) INTEGRATED CAPACITIVE DEVICE HAVING A THERMALLY VARIABLE CAPACITIVE VALUE

(71) Applicant: STMicroelectronics (Rousset) SAS, Rousset (FR)

(72) Inventors: Christian Rivero, Rousset (FR); Pascal Fornara, Pourrieres (FR); Antonio di-Giacomo, Rousset (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 13/688,022

(22) Filed: Nov. 28, 2012

(65) Prior Publication Data
US 2013/0147004 A1 Jun. 13, 2013

(30) Foreign Application Priority Data
Dec. 9, 2011 (FR) .................................. 11 61408

(51) Int. Cl.
*H01L 31/058* (2006.01)
(52) U.S. Cl.
USPC ............... 257/467; 257/E29.347; 438/54
(58) Field of Classification Search
USPC ............... 257/467, E29.347; 438/54
See application file for complete search history.

(56) References Cited

U.S. PATENT DOCUMENTS

| 6,498,347 | B2* | 12/2002 | Sauer et al. ............... 250/338.1 |
| 8,264,054 | B2* | 9/2012 | Cunningham et al. ....... 257/467 |
| 2010/0158072 | A1 | 6/2010 | Fornara et al. |
| 2010/0275904 | A1* | 11/2010 | Bathurst et al. ............ 126/600 |
| 2013/0146873 | A1* | 6/2013 | Fornara et al. ............... 257/48 |

FOREIGN PATENT DOCUMENTS

EP 2 202 767 A1 6/2010

OTHER PUBLICATIONS

Vayrette, R., et al., "Residual stress estimation in damascene copper interconnects using embedded sensors," Microelectronic Engineering, vol. 87, Issue 3, Mar. 2010, pp. 412-415.

* cited by examiner

*Primary Examiner* — Trung Q Dang
(74) *Attorney, Agent, or Firm* — Slater & Matsil, L.L.P.

(57) ABSTRACT

An integrated circuit, comprising a capacitive device having a thermally variable capacitive value and comprising a thermally deformable assembly disposed within an enclosure, and comprising an electrically-conducting fixed body and a beam held at least two different locations by at least two arms rigidly attached to edges of the enclosure, the beam and the arms being metal and disposed within the first metallization level. A part of the said thermally deformable assembly may form a first electrode of the capacitive device and a part of the said fixed body may form a second electrode of the capacitive device. The thermally deformable assembly has a plurality of configurations corresponding respectively to various temperatures of the said assembly and resulting in a plurality of distances separating the two electrodes and various capacitive values in the capacitive device corresponding to the plurality of distances.

20 Claims, 9 Drawing Sheets

INTEGRATED CAPACITIVE DEVICE HAVING A THERMALLY VARIABLE CAPACITIVE VALUE

This application claims the benefit of French Application No. 1161408, filed on Dec. 9, 2011, entitled "Integrated Capacitive Device having a Thermally Variable Capacitive Value," which application is hereby incorporated herein by reference.

TECHNICAL FIELD

The invention relates to integrated circuits, and more particularly, integrated capacitive devices having a thermally variable capacitive value.

SUMMARY OF THE INVENTION

In one aspect, embodiments of the presented principles provide for an integrated circuit, comprising a first metallization level disposed on a substrate and separated from a second metallization level by an insulating region and a capacitive device having a thermally variable capacitive value. The capacitive device may comprise an electrically-conducting fixed body and a thermally deformable assembly disposed within an enclosure, and the assembly may comprise a beam held at least two different locations by at least two arms rigidly attached to edges of the enclosure. The beam and the arms may be metal and disposed within the first metallization level. A part of the thermally deformable assembly forms a first electrode of the capacitive device a part of the fixed body forms a second electrode of the capacitive device. The thermally deformable assembly has a plurality of configurations corresponding respectively to various temperatures of the said assembly and resulting in a plurality of distances separating the two electrodes and various capacitive values in the capacitive device corresponding to the plurality of distances. The capacitive device is activatable for switching from one configuration to another.

Another embodiment of the presented principles provides for a device comprising a first pair of arms comprising a first arm and a second arm both rigidly attached to edges of an enclosure and disposed within a first metallization layer, the first arm and second arm being thermally deformable. The device may further comprise a beam disposed in the first metallization layer, with the first arm attached to a first face and the second arm attached to a second face opposite the first face. The first arm and the second arm are separated longitudinally along the beam and configured to move the beam in response to change in a temperature. A first electrode may be mounted to the beam and configured to move with the beam in response to the change in the temperature. A fixed body may be disposed in the enclosure and formed of a conductive material. A second electrode may be attached to the fixed body, and maintained at a fixed position, forming a capacitive device with the first electrode, the capacitive device having a capacitance varying with the movement of the first electrode.

Another embodiment of the presented principles provides for a device comprising a capacitive device disposed in an enclosure and disposed within a plurality of metallization layers, the capacitive device having a first electrode and a second electrode, the capacitance of the capacitive device being variable based on movement of at least one of the first electrode and the second electrode. A first arm and a second arm may both be rigidly attached to edges of the enclosure, and the first arm and second arm may be thermally deformable. The device may further comprise a beam, with the first electrode connected to the beam. The first arm and the second arm are connected to the beam and configured to move the beam and first electrode in response to change in a temperature of the first arm and the second arm.

BRIEF DESCRIPTION OF THE DRAWINGS

Others advantages and features of the invention will become apparent upon examining the detailed description of non-limiting embodiments and of the appended drawings, in which.

DETAILED DESCRIPTION OF ILLUSTRATIVE EMBODIMENTS

Figure 1:
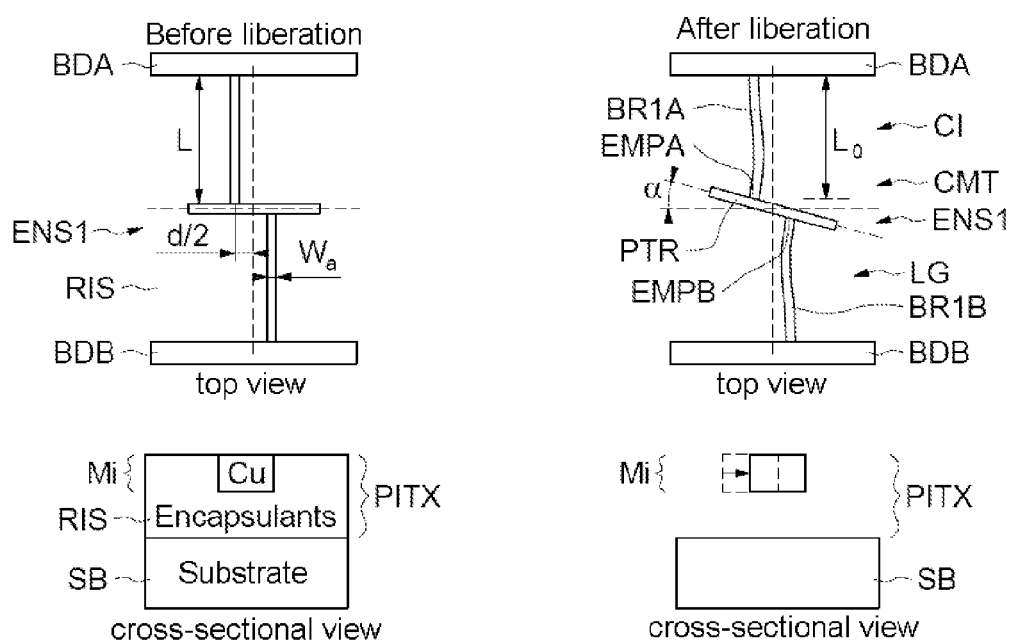
FIGS. 1 to 12, some of which are schematic, relate to various embodiments of a device according to the invention.

Before addressing the illustrated embodiments in detail, various embodiments and advantageous features are discussed generally in the following paragraphs.

According to one embodiment, a capacitive device is provided that has a thermally variable capacitive value which may be integrated into all the CMOS technological lines by the potential addition of only a few additional operations (the addition of a mask level, for example) and, in particular, without using the conventional technology of the MEMS type.

According to one embodiment, an integrated capacitive device is also provided which may be used as a temperature detector for detecting both an increase in temperature or else a fall in temperature, and also potentially the rate of variation in this temperature.

According to one embodiment, the solution is to use a thermally deformable assembly, formed within a metallization level of the integrated circuit, and to use the physical behavior of the metal forming this thermally deformable assembly subjected to a variation in temperature in order to modify the distance separating a part of this deformable element from an electrically conducting fixed body and to measure the variable capacitive value of the capacitor whose two electrodes are respectively formed by a part of this thermally deformable assembly and a part of the said fixed body.

According to one aspect, an integrated circuit is provided comprising on top of a substrate a part comprising several metallization levels separated by an insulating region. Such a part is commonly denoted by those skilled in the art by the acronym BEOL (for "Back End Of Line").

According to one general feature of this aspect, the integrated circuit furthermore comprises, within the said part, a capacitive device having a thermally variable capacitive value, comprising within an enclosure a thermally deformable assembly including a beam held at least two different locations by at least two arms rigidly attached to edges of the enclosure, the beam and the arms being metal and situated within the same metallization level; the capacitive device also comprises an electrically conducting fixed body; a part of the thermally deformable assembly forms a first electrode of the capacitive device and a part of the said fixed body forms a second electrode of the capacitive device; the said assembly has various configurations corresponding respectively to various temperatures of the said assembly and to various distances separating the two electrodes, so as to respectively give various capacitive values to the capacitive device; and the said assembly is activatable for switching from one configuration to another.

Such a capacitive device is thus formed within the part known as BEOL of the integrated circuits, within the same metallization level or else within different metallization levels, and the said assembly has an essentially two-dimensional and metal structure. The capacitive device may therefore be readily integrated into a CMOS technological line, by broadly using the conventional fabrication steps of the BEOL part of the integrated circuit.

The thermally deformable assembly can be thermally activatable or else electrically activatable, the increase in temperature being, in the latter case, obtained by Joule heating from the flow of a current within the said assembly.

The said part of the body forming the second electrode can be situated within the same metallization level as that within which the beam and the arm are situated, or else within a different metallization level.

Various embodiments of the assembly are possible, comprising a beam held at various locations by at least two arms or even two pairs of arms, where at least some of the arms can comprise several parallel branches.

Referring to FIG. 1, it can be seen that the capacitive device CMT is formed within the same metallization level Mi of the interconnection part PITX of the integrated circuit CI, this interconnection part also being commonly denoted by those skilled in the art by the acronym BEOL.

This part PITX is situated on top of the substrate SB.

In the examples described here, the device CMT is made of metal, and more particularly of copper. However, the metal could be aluminium or tungsten without these two examples being limiting.

Here, the device CMT comprises an assembly ENS1 in the shape of an asymmetric cross. This assembly ENS1 comprises a first arm BR1A and a second arm BR1B rigidly attached to a beam PTR, also called "central pointer", at two locations EMPA and EMPB respectively situated on two opposing faces of the beam PTR. These two locations EMPA and EMPB are spaced apart by a distance d.

As will be seen in more detail hereinafter, the assembly ENS1 is fabricated using conventional techniques for formation of the metal tracks of the interconnection part PITX, notably used in CMOS technology.

The left-hand part of FIG. 1 shows the device CMT, and more particularly the assembly ENS1 encapsulated within an insulating region RIS whereas the right-hand part of FIG. 1 shows the same assembly after etching away of the insulating region so as to liberate the arms BR1A and BR1B together with the beam PTR.

The assembly ENS1, thus liberated, therefore lies inside an enclosure LG resulting from the removal of the insulating region RIS, the two arms BR1A and BR1B being rigidly attached to the edges BDA and BDB of the enclosure.

In the article by R. Vayrette, et al, entitled, "Residual stress estimation in damascene copper interconnects using embedded sensors," Microelectronics Engineering, Vol. 87 (2010) 412-415, it has been shown that, after disencapsulation of an assembly of this type, there is a relaxation of the stresses, which causes a residual longitudinal deformation of the arms causing a deviation a of the pointer, here in the clockwise direction.

More precisely, if the arm is assumed to have a constant width Wa, the deviation a is expressed by the following formula:

$$a = \frac{d \cdot L \cdot L_0 (L - L_0)}{d^2(2L - L_0) + \frac{4}{3} \cdot W_a^2 \cdot L_0}$$

where $L_0$ is the length of the arms after relaxation $$L_0 \text{ is equal to } \frac{L}{1 + \frac{\sigma}{E}}$$

where $\sigma$ denotes the average residual longitudinal stress and E the Young's modulus of the material (equal to around 130 GPa for isotropic copper).

$\sigma$ is determined experimentally from measurements carried out on test structures having various values of d and various values of Wa. Thus, for 1/d equal to 2 µm−1 and Wa equal to 0.5 µm, $\sigma$ is equal to around 800 MPa.

By way of example, for arms of length 10 microns and of width 0.2 microns, the deviation of the pointer is around 0.2 microns for a spacing d of 2 microns. For a spacing of 1 micron, the deviation a is around 0.3 microns. This is understood to be for switches annealed at 400° with an insulating region RIS of 0.56 microns.

For a line width (width of arm) of around 0.2 microns, an average residual longitudinal deformation is obtained in the range between 0.25% and 0.30% for a line width (width of the arms) of 0.5 microns, 0.20% for a line width of 1 micron, and little less than 0.20% for a line width of 2 microns.

Depending on the applications that will be envisaged, and notably depending on the desired precision, for example in the case of a temperature detection, this residual deviation a of the pointer PTR may or may not be taken into account.

Figure 2:
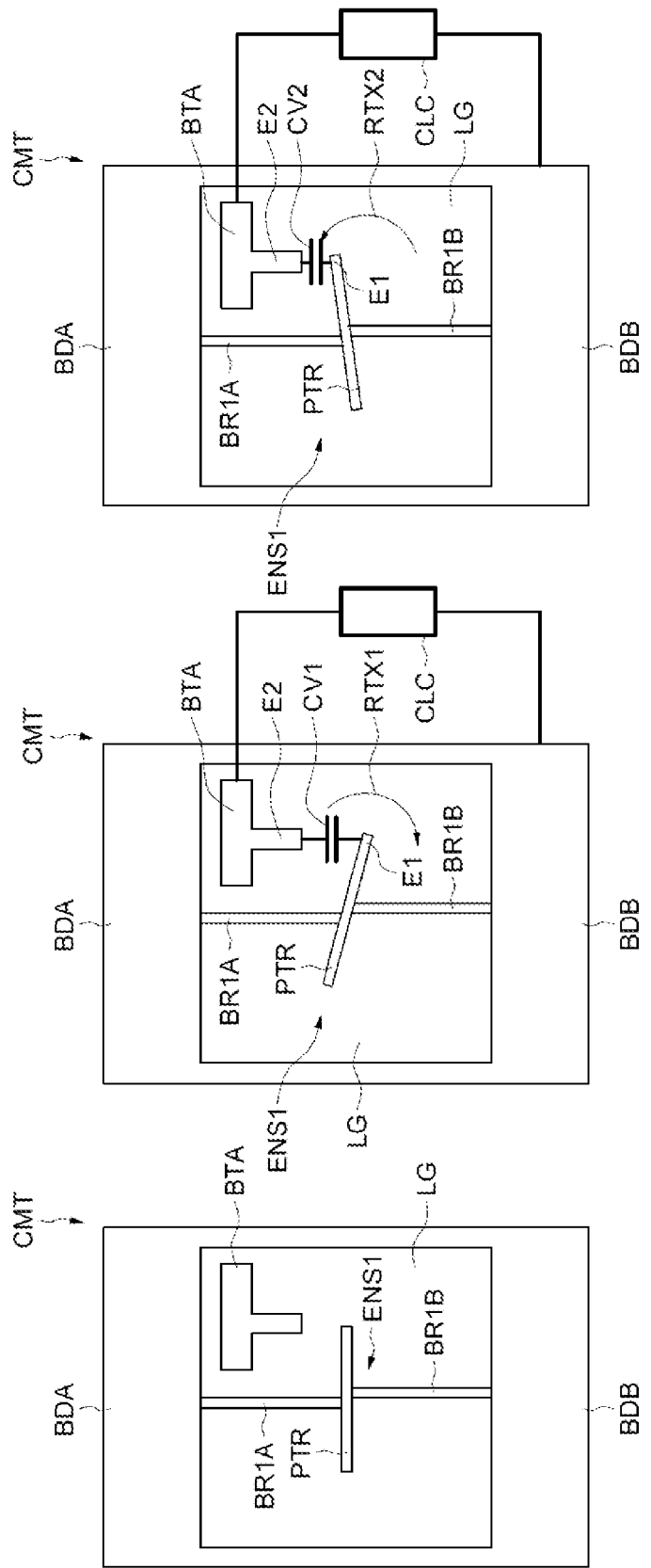

In the example illustrated in FIG. 2, the capacitive device CMT comprises, aside from the assembly ENS1, an electrically-conducting buffer BTA, for example a metal buffer, also formed within the same metallization level as that in which the assembly ENS1 has been formed.

In the left-hand part of FIG. 2, the assembly ENS1 before disencapsulation from the insulating region RIS is shown, and in the central part of FIG. 2, the same assembly ENS1 after disencapsulation, in other words liberated from the insulating region RIS, is shown. In the example shown here, the residual deviation of the beam PTR (pointer) is taken into account that is associated with the relaxation of the stresses upon liberation of the assembly ENS1 from the insulating region RIS that was surrounding it.

As illustrated in the central part and the right-hand part of FIG. 2, one part of the thermally deformable assembly ENS1, in this case here the right-hand end of the beam PTR, forms a first electrode E1 for the capacitive device CMT, whereas one part of the buffer BTA, in this case the part which is facing the right-hand end of the beam PTR, forms a second electrode E2 of the capacitive device.

The dielectric of the capacitor thus formed consists of the air in the enclosure LG.

In the central part of FIG. 2, the assembly ENS1 has a first configuration when it has a first temperature, for example ambient temperature. In this first configuration, the beam is at a first distance from the buffer BTA.

In other words, in this first configuration, the two electrodes E1 and E2 of the capacitive device CMT are at a first distance giving the capacitive device a first capacitive value CV1.

In the right-hand part of FIG. 2, the assembly ENS1 has been thermally activated so as to assume a second configuration in which the electrode E1 has come closer to the electrode E2, thus giving the capacitive device CMT a different capacitive value CV2.

This thermal activation has been caused by an increase in temperature of the expansion arms BR1A and BR1B.

Indeed, owing to the increase in temperature, these arms expand and, since the two fixing points of the two arms BR1A and BR1B onto the beam PTR are spaced out in the longitudinal direction of the beam, this expansion causes a non-zero moment of force resulting in a rotation RTX2 of the beam PTR in the anticlockwise direction, this rotation RTX2 being the reverse of the rotation RTX1 (central part of FIG. 2) resulting from the relaxation of the stresses on the assembly ENS1.

With a knowledge of the thermal coefficient of expansion of the material forming the expansion arms, the geometry of the arms, notably their length and their width and also their thickness, and the spacing d between the two fixing points, the deviation of the pointer PTR resulting from the rotation RTX2 can readily be simulated.

As a consequence, the buffer BTA can be positioned within the enclosure for example in such a manner that the capacitive device may be used as a temperature detector for a temperature varying within a predefined range.

Figure 3:
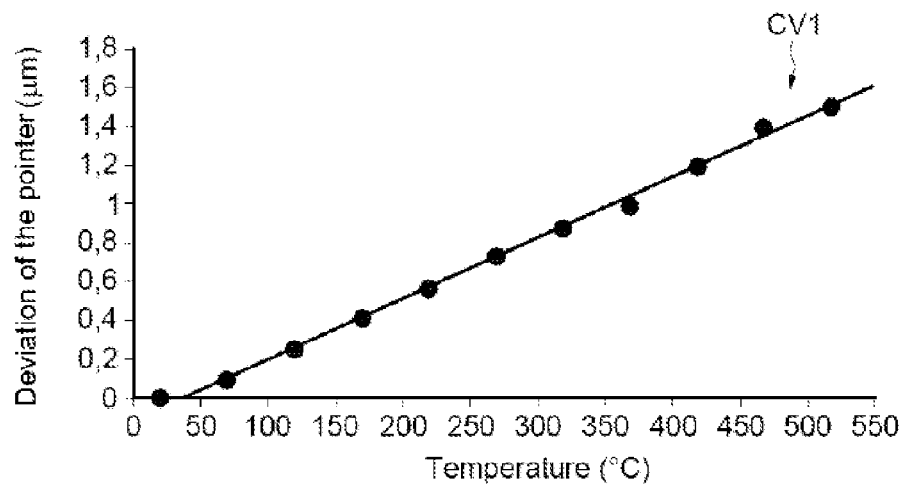

By way of example, for an arm width of 0.2 micron, an arm length of 10 microns and a spacing of 0.4 micron, the curve CV1 (FIG. 3) illustrates the deviation of the pointer PTR as a function of temperature.

The determination of the capacitive value CVi may be carried out by connecting a specific electrical circuit CLC (FIG. 2) to the two electrodes E1 and E2.

Such circuits are conventional and known per se. Digital means that measure the period of vibration of a circuit containing the capacitor whose capacitive value is to be measured may notably be mentioned. Means may also be mentioned that allow the measurement of a time required for charging the capacitor to a certain value, with the assumption that a constant current flows through this capacitor. Means may also be mentioned that comprise a source of alternating current placed across the terminals of a Wheatstone bridge circuit, containing, in one branch, the capacitor whose capacitive value it is desired to measure, and, in another branch, a reference capacitor having variable and known reference capacitive values.

It should be noted that such a capacitive device CMT can also allow both a fall in temperature and an increase in temperature to be detected.

More precisely, when the temperature falls below ambient temperature corresponding to the configuration illustrated in the central part of FIG. 2, there is then a thermal contraction of the arms of the assembly EMS1, and the beam PTR undergoes a rotation in the clockwise direction, so as to increase the distance between the electrodes E1 and E2 and thus to give another capacitive value to the capacitive device.

Furthermore, such a device can allow not only the detection of the value of the temperature, but also of the rate of variation of temperature, by measuring, for example by means of the circuit CLC, the rate of variation of the capacitive value of the capacitive device.

Figure 4:
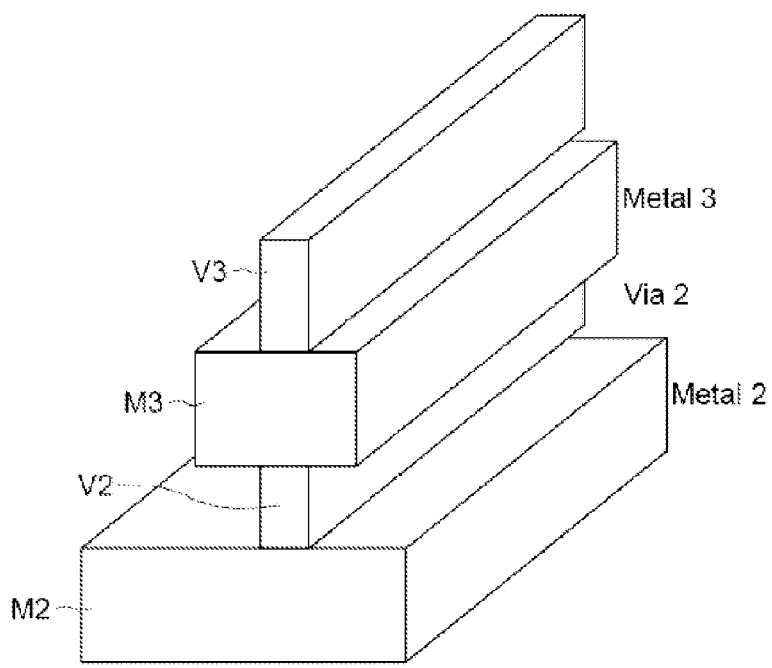
Figure 5:
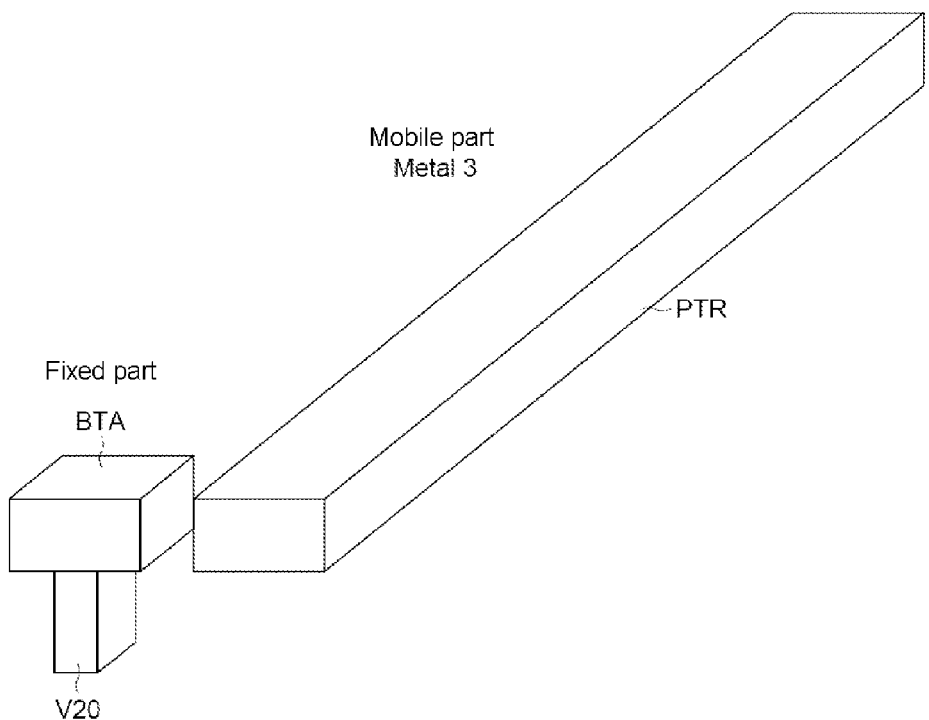
Figure 6:
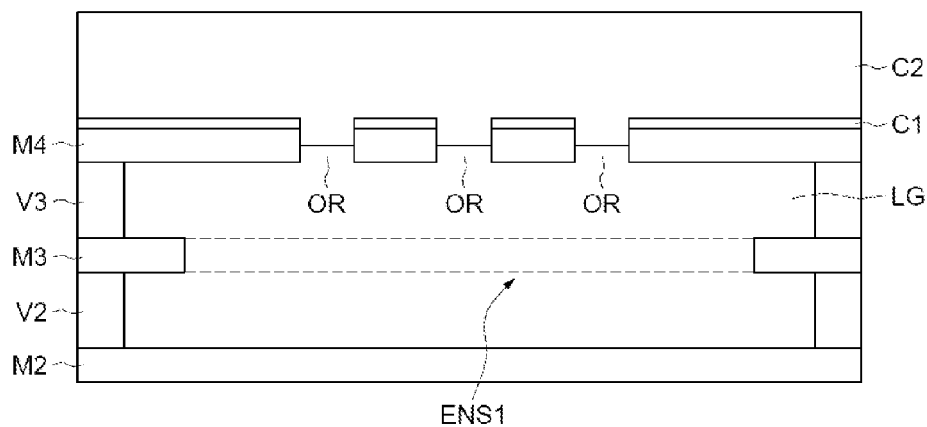

Reference is now more particularly made to FIGS. 4 to 6, in order to illustrate a mode of fabrication of one exemplary embodiment of a capacitive device CMT according to the invention.

In these figures, it is assumed that the assembly ENS1, together with the buffer BTA, are fabricated within the metallization level M3 (Metal 3).

It can then be seen (FIG. 4) that the level V2 of vias 2 between the metal level 2 and the metal level 3 and the level V3 of vias 3 between the metal 3 and the metal 4 are used to form a "protective wall" for the subsequent oxide etch and to allow the disencapsulation of the assembly ENS1 and of the various buffers.

Furthermore, as illustrated in FIG. 5, both the mobile part of the capacitive device CMT, in this case the beam PTR, and also the fixed part, in this case the buffer BTA, are formed within the metal level 3. Furthermore, the buffer BTA is connected to the metal level 2 through a via V20.

The capacitive device CMT, and notably the assembly ENS1, are fabricated by using conventional fabrication steps for metallization levels and for vias. More precisely, as illustrated in FIG. 6, after formation of the metal level M2 and of via level V2, the assembly ENS1, shown here with a dashed line for simplification, is fabricated in a conventional manner by etching away of the underlying oxide and deposition of metal, in this case copper, into the trenches. Then, the assembly is covered with oxide and the metallization level M4 is subsequently formed.

After formation on the metal level 4 of a conventional layer of nitride C1, the formation of a comb within this metal level 4 is then carried out so as to form orifices OR.

Then, an isotropic dry etching step is carried out followed by a wet etching step for example with hydrofluoric acid, so as to eliminate the insulating region (oxide) encapsulating the assembly ENS1 together with the buffer, and thus to also form the enclosure LG.

Then, a non-conformal deposition of oxide is carried out so as to form a layer C2 filling the orifices OR.

It goes without saying that what has just been described for the metal levels M2, M3, M4 can be generalized to the metal levels Mi−1, Mi, Mi+1.

The conventional process for formation of the various upper metallization levels is then carried out.

Figure 8:
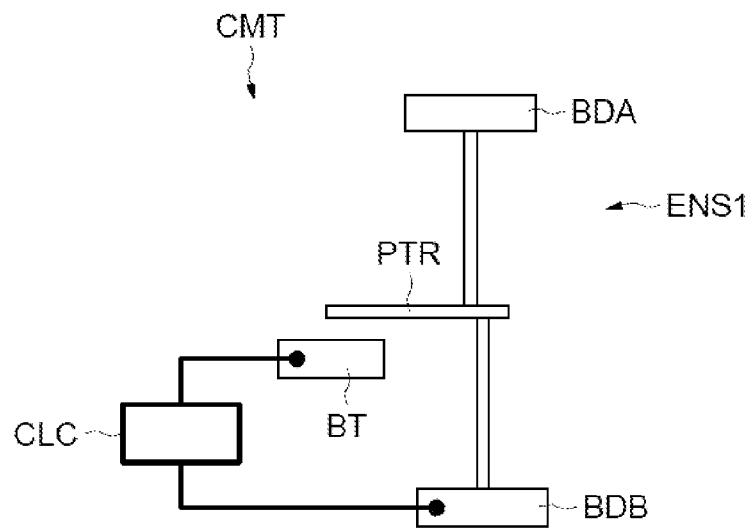

In the embodiments that have just been described, the capacitor whose thermally variable capacitive value CVi it is desired to measure is, as illustrated in the left-hand part of FIG. 8, a metal/air/metal capacitor formed essentially in the XY plane, and the capacitive value depends on the distance in the XY plane between two metal electrodes E1 and E2 formed within the same metallization level, in this case the metal level n referenced Mn.

Figure 7:
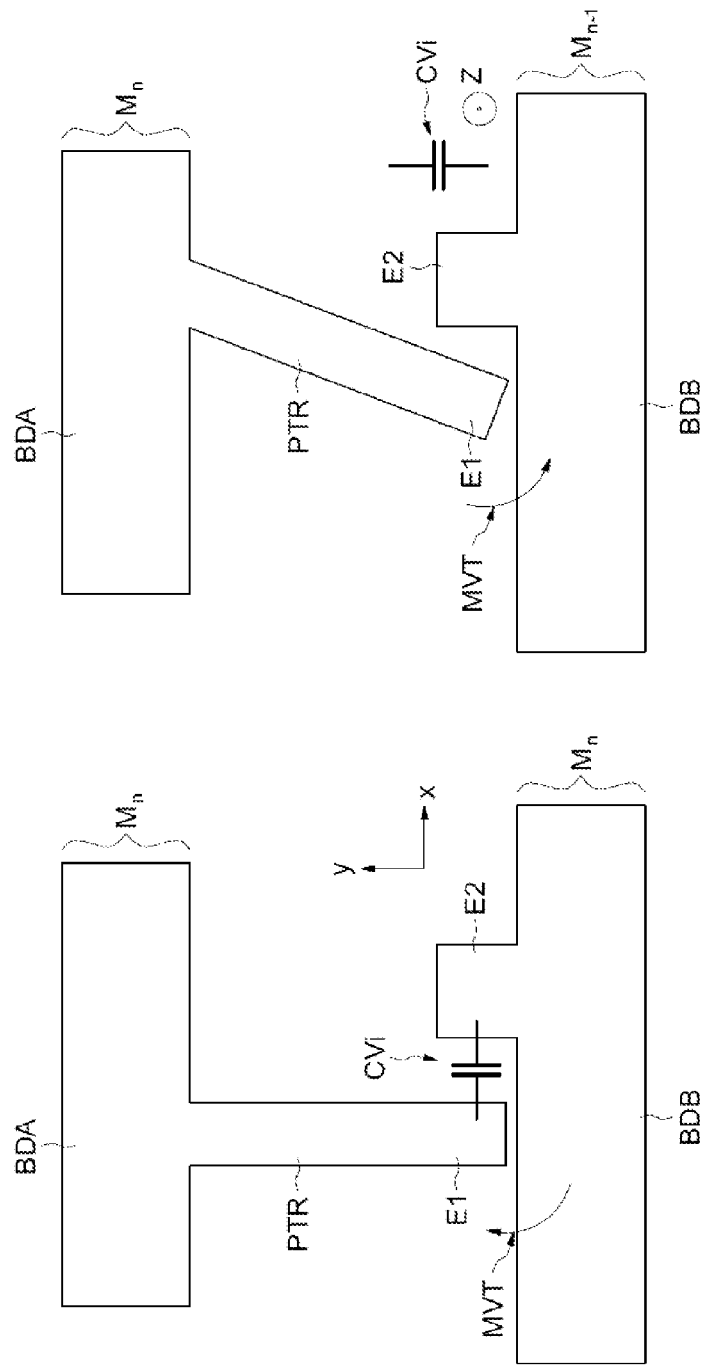

However, as a variant, as illustrated very schematically in FIG. 7, it would be possible to produce a capacitive device whose two electrodes E1 and E2 were disposed in two different metallization levels, in this case two adjacent metallization levels, for example the metal level Mn for the electrode E1, and the metal level Mn−1 for the electrode E2.

In this respect, from a fabrication point of view, it would simply be necessary to provide one additional level of vias and one additional metallization level.

In this case, the metal/air/metal capacitor also has a component along the Z axis, since by way of its movement MVT, the beam PTR can then come closer to or move away from the electrode E2, or even pass over it.

Other variant embodiments of the capacitive device CMT are possible.

Thus, as illustrated in FIG. 8, the two arms of the assembly ENS1 are connected in the neighbourhood of a first end of the beam PTR. Of course, the two fixing points of the two arms onto the beam are here again spaced out in the longitudinal direction of the beam PTR.

The other end of the beam PTR can then come closer to or move further away from an electrically-conducting buffer BT, for example a metal buffer, as a function of the temperature applied to the assembly ENS1.

In the example described here, the electrical circuit CLC is here again connected between the buffer BT and the edge BDB of the enclosure.

Figure 9:
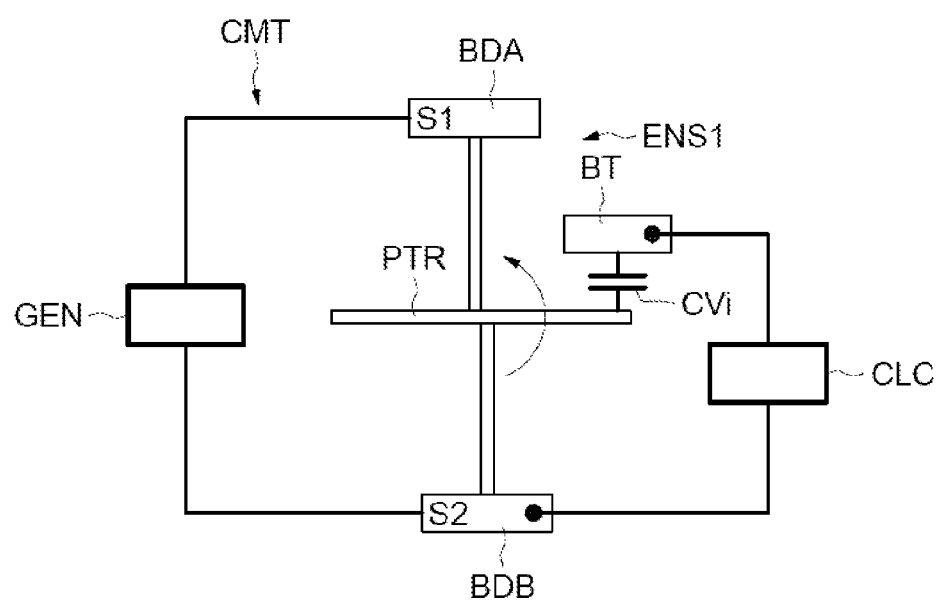

As a variant, as illustrated in FIG. 9, the assembly ENS1, which is thermally deformable, can be activatable electrically.

Indeed, means GEN, conventional and known per se, are then provided, capable of driving an electrical current in at least one of the arms of the assembly ENS1, in this case in the two arms ENS1, between the two edges BDA and BDB of the enclosure. Ground could be applied to the point S2 and a voltage Vdd to the point S1.

Consequently, the Joule heating produces an increase in temperature of the two arms, which then causes the deviation of the beam PTR.

It can therefore be seen, in this exemplary embodiment, that the capacitive value CVi depends on only on the temperature of the assembly ENS1 but also on the intensity of the current flowing through this assembly ENS1. As a consequence, a possible application of the invention could consist in using the capacitive device CMT for measuring, by means of the circuit CLC, the intensity of the current passing through another part of the integrated circuit which would be connected instead and in place of the generator GEN.

Another possible application could consist in connecting the capacitor with variable capacitive value to the circuit CLC containing a resistive-capacitive resonant circuit and using this capacitor with variable capacitive value for modulating the resulting resistive-capacitive circuit, and therefore the resonance frequency, using the electrical control of the capacitor with variable capacitive value, in other words using the intensity of the current flowing in this capacitor.

Figure 10:
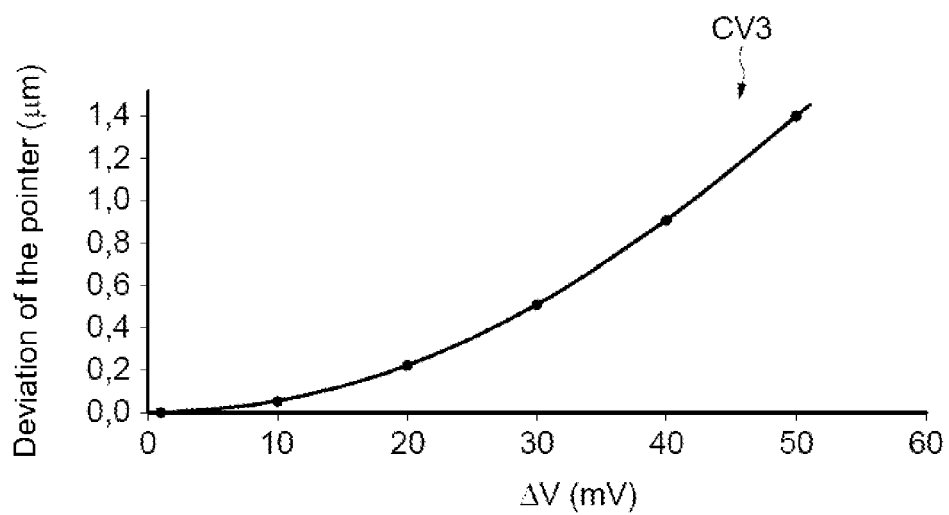

FIG. 10 illustrates, by way of example, a curve CV3 showing the behaviour of the deviation of the pointer PTR as a function of the potential difference applied between the points S1 and S2, again for a line width of 0.2 micron.

It goes without saying that all the embodiments which have been described prior to FIG. 9 can also be used when the switch is electrically activatable.

Figure 11:
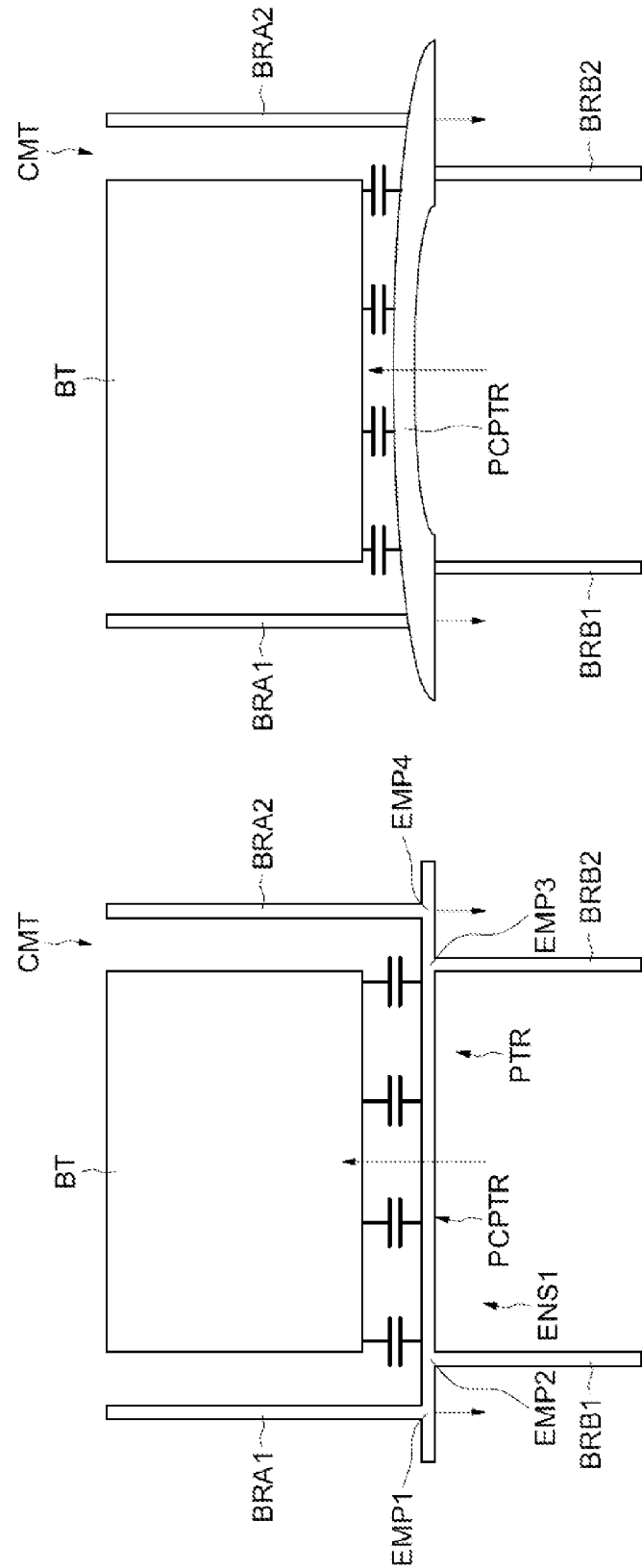
Figure 12:
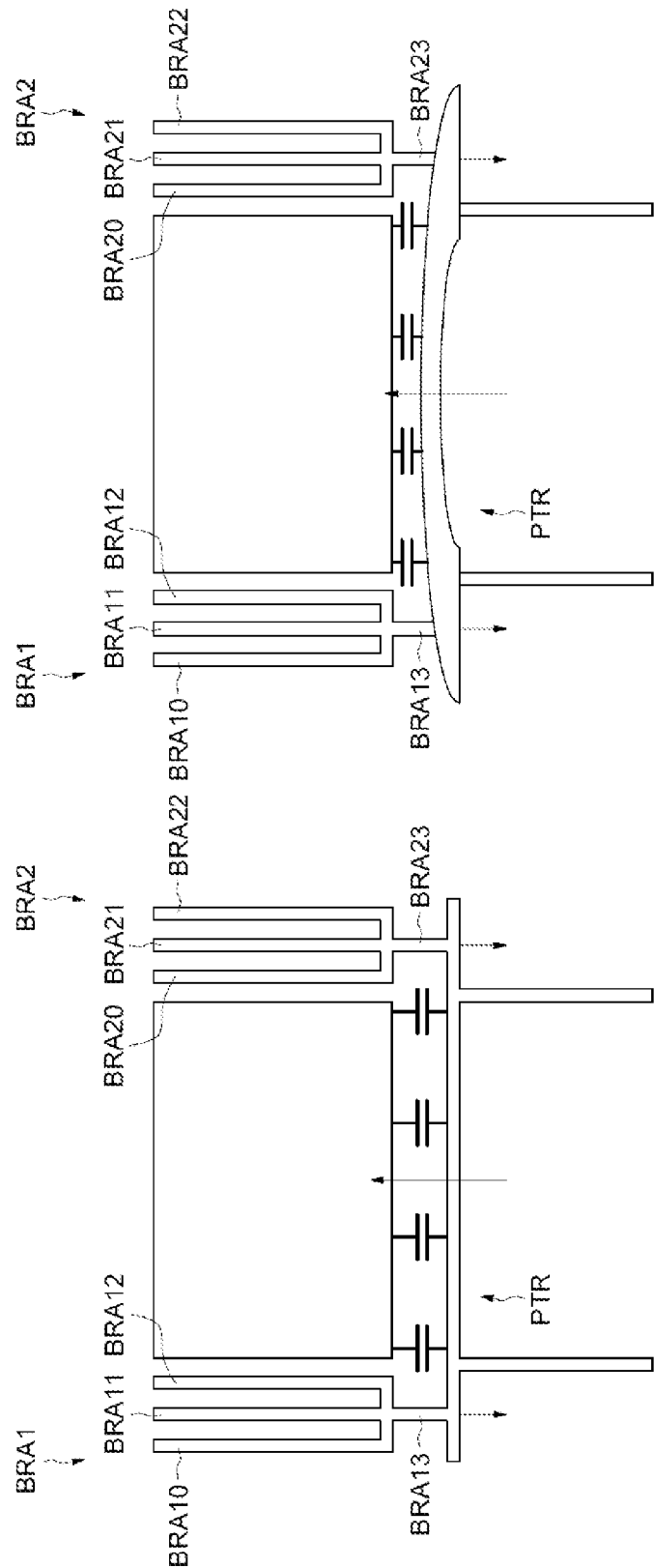

FIGS. 11 and 12 illustrate two other embodiments of the capacitive device CMT.

In FIG. 11, the assembly ENS1 comprises a first pair of first arms BRA1, BRA2, respectively fixed onto a first face of the beam PTR at the locations EMP1 and EMP4 situated in the neighbourhood of the two ends of the beam PTR.

The assembly ENS1 also comprises a second pair of second arms BRB1, BRB2 respectively fixed onto a second face of the beam PTR, opposite the first face, at two locations EMP2, EMP3 respectively situated in the neighbourhood of the two ends of the part PCPTR of the beam situated between the arms of the first pair BRA1, BRA2.

This part PCPTR of the beam, which includes the central part of the beam, is situated, as illustrated in the left-hand part of FIG. 11, when the assembly ENS1 is in its first configuration, out of contact with the buffer BT.

Of course, here again, the locations EMP1 and EMP2 are spaced out in the longitudinal direction of the beam as are the locations EMP3 and EMP4.

In this variant embodiment, the central part PCPTR of the beam forms the first electrode E1 while the buffer BT forms the second electrode E2 of the capacitor.

In the configuration illustrated in the left-hand part of FIG. 11, the metal/air/metal capacitor thus formed exhibits a first capacitive value.

As illustrated in the right-hand part of FIG. 11, in the presence of an increase in temperature of the arms BRA1 and BRA2, whether this increase be caused thermally or electrically by Joule heating, there is an expansion of the arms BRA1 and BRA2 and curvature of the central part PCPTR of the beam which then ends up in a second configuration at another distance from the buffer BT.

For this reason, the capacitive value of the metal/air/metal capacitor has then changed.

In FIG. 12, each arm BRA1, BRA2 comprises several parallel branches, here three parallel branches BRA10-BRA12 and BRA20-BRA22 respectively connected to the beam PTR by two end parts BRA13 and BRA23 rigidly attached to the beam PTR.

Such an embodiment allows more marked thermal deformations to be obtained.

What is claimed is:

1. An integrated circuit, comprising:
a first metallization level disposed on a substrate and separated from a second metallization level by an insulating region;
a capacitive device having a thermally variable capacitive value and comprising:
a thermally deformable assembly disposed within an enclosure, and comprising a beam held at least two different locations by at least two arms rigidly attached to edges of the enclosure, the beam and the arms being metal and disposed within the first metallization level; and
an electrically-conducting fixed body;
wherein a part of the said thermally deformable assembly forms a first electrode of the capacitive device;
wherein a part of the said fixed body forms a second electrode of the capacitive device;
wherein the said thermally deformable assembly has a plurality of configurations corresponding respectively to various temperatures of the said assembly and resulting in a plurality of distances separating the first electrode and second electrode and various capacitive values in the capacitive device corresponding to the plurality of distances; and
wherein the said capacitive device is activatable for switching from one configuration to another.

2. The integrated circuit according to claim 1, wherein the said part of the body forming the said second electrode is disposed within the first metallization level.

3. The integrated circuit according to claim 1, wherein the said part of the body forming the said second electrode is disposed within a metallization level different from the first metallization level.

4. The integrated circuit according to claim 1, wherein the said part of the said thermally deformable assembly forming the first electrode is a part of the beam.

5. The integrated circuit according claim 1, wherein the said thermally deformable assembly comprises the said beam and two arms respectively rigidly attached to the beam on two opposing faces of the said beam, at two fixing points spaced out in a longitudinal direction of the beam.

6. The integrated circuit according to claim 5, wherein the said part of the said thermally deformable assembly forming the first electrode is an end part of the beam.

7. The integrated circuit according to claim 1, wherein the thermally deformable assembly comprises a first pair of first arms respectively fixed onto a first face of the beam, each adjacent to respective one of two ends of the said beam, a second pair of second arms fixed onto a second face of the said beam, opposite the first face, each adjacent to respective one of two ends of the said beam, situated between the arms of the first pair, wherein a fixing point of a first arm and a fixing point of an adjacent second arm are spaced out in a longitudinal direction of the beam.

8. The integrated circuit according to claim 7, wherein each first arm comprises a plurality of branches attached to the said beam.

9. The integrated circuit according claim 8, in which the said part of the said thermally deformable assembly forming the first electrode is a part of the beam situated between the arms.

10. The integrated circuit according to claim 1, in which the said thermally deformable assembly is thermally activatable.

11. The integrated circuit according to claim 1, further comprising means for applying an electrical current to at least one part of the said thermally deformable assembly and generates a temperature dependent on the current.

12. The integrated circuit according to claim 1, furthermore comprising an electrical circuit connected to the first electrode and the second electrode and configured to determine a capacitance of the capacitive device.

13. A device, comprising:
a first pair of arms comprising a first arm and a second arm both rigidly attached to edges of an enclosure and disposed within a first metallization layer, the first arm and second arm being thermally deformable;
a beam disposed in the first metallization layer, the first arm attached to a first face and the second arm attached to a second face opposite the first face, the first arm and the second arm separated longitudinally along the beam and configured to move the beam in response to change in a temperature;
a first electrode mounted to the beam and configured to move with the beam in response to the change in the temperature;
a fixed body disposed in the enclosure and formed of a conductive material; and
a second electrode attached to the fixed body, and maintained at a fixed position, forming a capacitive device with the first electrode, the capacitive device having a capacitance varying with the movement of the first electrode.

14. The device according to claim 13, wherein at least a part of the second electrode is disposed within a second metallization layer different from the first metallization layer.

15. The device according to claim 13, wherein the first electrode is a part of the beam.

16. The device according to claim 13, further comprising a second pair of arms comprising a third arm and a fourth arm both rigidly attached to edges of the enclosure and disposed within a first metallization layer, the third arm and fourth arm being thermally deformable, the third arm attached to the first face of the beam and the fourth arm attached to the second face of the beam, and wherein the first electrode is mounted between the first pair of arms and the second pair of arms.

17. A device, comprising:
a capacitive device disposed in an enclosure and disposed within a plurality of metallization layers, the capacitive device having a first electrode and a second electrode, the capacitance of the capacitive device being variable based on movement of at least one of the first electrode and the second electrode;
a first arm and a second arm both rigidly attached to edges of the enclosure, the first arm and second arm being thermally deformable; and
a beam, the first electrode connected to the beam, the first arm and the second arm connected to the beam and configured to move the beam and first electrode in response to change in a temperature of the first arm and the second arm.

18. The device according to claim 17, further comprising current source configured to apply an electrical current to at least one of the first arm and the second arm and generate a temperature dependent on the current.

19. The device according to claim 17, furthermore comprising an electrical circuit connected to the first electrode and the second electrode and configured to determine a capacitance of the capacitive device.

20. The device according to claim 17, wherein the second electrode is disposed in a first metallization layer of the plurality of metallization layers, and the second electrode is disposed in a second metallization layer of the plurality of metallization layers.

* * * * *

UNITED STATES PATENT AND TRADEMARK OFFICE
CERTIFICATE OF CORRECTION

PATENT NO. : 8,704,327 B2  
APPLICATION NO. : 13/688022  
DATED : April 22, 2014  
INVENTOR(S) : Christian Rivero et al.

Page 1 of 1

It is certified that error appears in the above-identified patent and that said Letters Patent is hereby corrected as shown below:

In the Claims:

In Col. 8, line 24, claim 1, after "beam held" insert --at--.
In Col. 9, line 7, claim 9, after "according" insert --to--.
In Col. 9, line 11, claim 10, after "according" insert --to--.

Signed and Sealed this
Seventeenth Day of June, 2014

Michelle K. Lee
*Deputy Director of the United States Patent and Trademark Office*